United States Patent
Tseng

[11] Patent Number: 5,843,821
[45] Date of Patent: Dec. 1, 1998

[54] FABRICATION METHOD FOR A CYLINDRICAL CAPACITOR FOR A SEMICONDUCTOR DEVICE

[75] Inventor: Horng-Huei Tseng, Hsinchu, Taiwan

[73] Assignee: Vanguard International Semiconductor Corporation, Hsin-Chu, Taiwan

[21] Appl. No.: 868,605

[22] Filed: Jun. 4, 1997

[51] Int. Cl.⁶ .............................................. H01L 21/8242
[52] U.S. Cl. ........................ 438/253; 438/254; 438/397
[58] Field of Search ................................... 438/238–239, 438/253–254, 396–397, 947; 257/306, 309

[56] References Cited

U.S. PATENT DOCUMENTS

| | | | |
|---|---|---|---|
| 5,266,512 | 11/1993 | Kirsch | 438/396 |
| 5,545,582 | 8/1996 | Roh | 438/396 |
| 5,552,334 | 9/1996 | Tseng | 438/397 |
| 5,554,557 | 9/1996 | Koh | 437/52 |
| 5,578,516 | 11/1996 | Chou | 437/52 |
| 5,583,069 | 12/1996 | Ahn et al. | 437/52 |

*Primary Examiner*—Joni Chang
*Attorney, Agent, or Firm*—George O. Saile; Stephen B. Ackerman; William J. Stoffel

[57] ABSTRACT

The present invention provides a method of manufacturing a capacitor for a high density memory device. The capacitor has a bottom electrode 70 having cylindrical walls 54A more closely spaced than the minimum photolithography dimensions. The method begins by providing a first conductive layer 30 that contacts the substrate. A polyoxide layer 36A is used to form an opening over the first conductive layer 30 that defines a dielectric stud 50. An important feature is the polyoxide layer 36A makes the opening 38A smaller than the photolithographic limits. Cylindrical walls 54A are formed on the sidewalls of the dielectric stud 50. Subsequent etches are used to form the bottom electrode 54A, 30B (70). The electrode of the present invention is smaller than the conventional minimum photo ground rules and the method is cost effective and highly manufacturable.

8 Claims, 6 Drawing Sheets

FABRICATION METHOD FOR A CYLINDRICAL CAPACITOR FOR A SEMICONDUCTOR DEVICE

Background of Invention

1) Field of the Invention

This invention relates generally to the fabrication of capacitors in semiconductor devices and more particularly to a method for fabricating high density capacitors with increased capacitance using a polyoxide layer masking technique.

2) Description of the Prior Art

Very large scale integration (VLSI) semiconductor technologies have dramatically increased the circuit density on a chip. The miniaturized devices making up these circuits are very closely spaced and their packing density has increased significantly. More recent advances in photolithographic techniques, such as phase-shifting masks, and self-aligning process steps have further reduced the device sized and increased circuit density. This has lead to ultra large scale integration (ULSI) with minimum device dimensions less than a micrometer and more than a million transistors on a chip. With this improved integration, some circuit elements experience electrical limitation due to their down sizing.

One such circuit element experiencing electrical limitations is the array of storage cells on a dynamic random access memory (DRAM) chip. These individual DRAM storage cells, usually consisting of a single metal-oxide-semiconductor field-effect-transistor (MOS-FET) and a single capacitor are used extensively in the electronic industry for storing data. A single DRAM cell stores a bit of data on the capacitor as electrical charge. The decrease in cell capacitance caused by reduced memory cell area is a serious obstacle to increasing packing density in dynamic random access memories (DRAMs). Thus, the problem of decreased cell capacitance must be solved to achieve higher packing density in a semiconductor memory device, since decreased cell capacitance degrades read-out capability and increases the soft error rate of memory cell as well as consumes excessive power during low-voltage operation by impeding device operation.

Generally, in a 64 MB DRAM having a 1.5 $\mu m^2$ memory cell area employing an ordinary two dimensional stacked capacitor cell, sufficient cell capacitance cannot be obtained even though a higher dielectric constant material, e.g., tantalum oxide ($Ta_2O_5$), is used. Therefore, stacked capacitors having a three-dimensional structure have been suggested to improve cell capacitance. Such stacked capacitors include, for example double-stacked, fin-structured, cylindrical, spread-stacked, and box structured capacitors.

Workers in the art are aware of the challenges to produce small high capacitance DRAM capacitors. For example, U.S. Pat. No. 5,554,557 (Koh) shows a method of forming a stacked capacitor. U.S. Pat. No. 5,578,516 (Chou) shows a method of manufacturing a stacked capacitor having upright extending cylindrical walls. U.S. Pat. No. 5,583,069 (Ahn et al.) shows a method of forming a capacitor having a double cylindrical electrode.

However, many of the prior art methods require substantially more processing steps or/and planar structures which make the manufacturing process more complex and costly. Also, other process methods rely on etching to a predetermined etch depth which can be quite difficult to control in a manufacturing environment. For example, during plasma etching outgassing, virtual or real leaks, back streaming from pumps and loading effects, to name a few, can change the chemistry of the etching environment in the process chamber, making a calibrated etch time approach difficult to control. Therefore, it is very desirable to develop processes that are as simple as possible and that further increase the cell capacitance.

There is a challenge to develop methods of manufacturing these capacitors that minimize the manufacturing costs and maximize the device yields. In particular, there is a challenge to develop a method which minimizes the number of photoresist masking operations and provides maximum process tolerance to maximize product yields. More particularly, a self-aligned contact node structure is required to increase process tolerances and yields. There is also a challenge to develop a capacitor which is not limited in size by size the photolithographic techniques. There is a need for a capacitor with higher capacitance and high packing density.

SUMMARY OF THE INVENTION

It is an object of the present invention to provide a method for fabricating a capacitor which can overcome the size limitations of conventional photographic masking techniques and has a high capacitance.

It is an object of the present invention to provide a method for fabricating a capacitor having cylindrical storage node with a high density and capacitance.

It is an object of the present invention to provide a method for fabricating a bottom electrode having a center electrode hole with a diameter smaller than the minimum photolithography ground rule.

Figure 1:
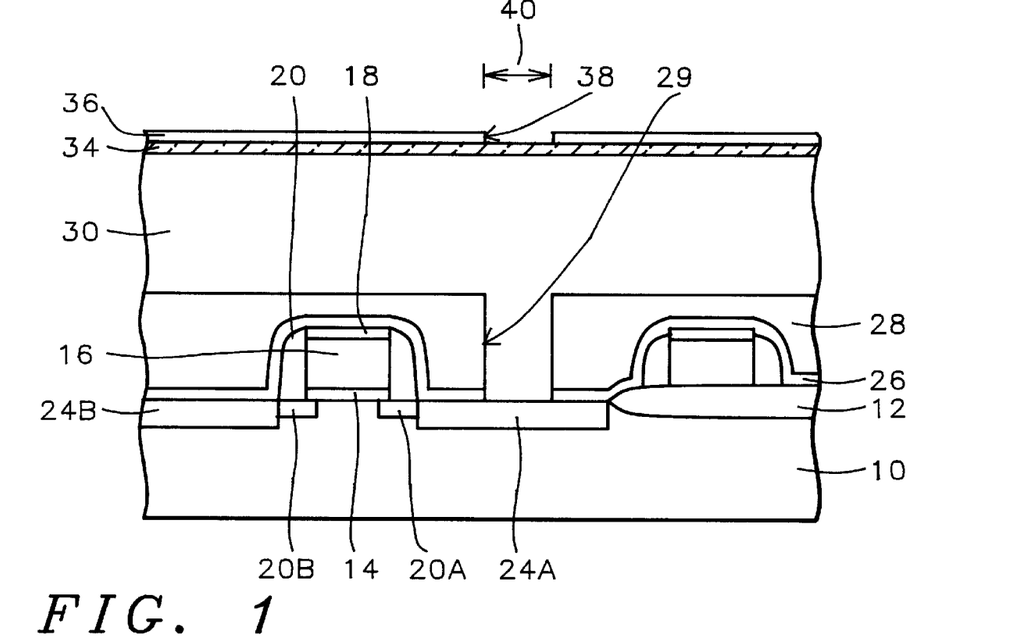
FIGS. 1 through 10 are cross sectional views for illustrating a method for manufacturing a cylindrical capacitor according to the present invention.
Figure 2:
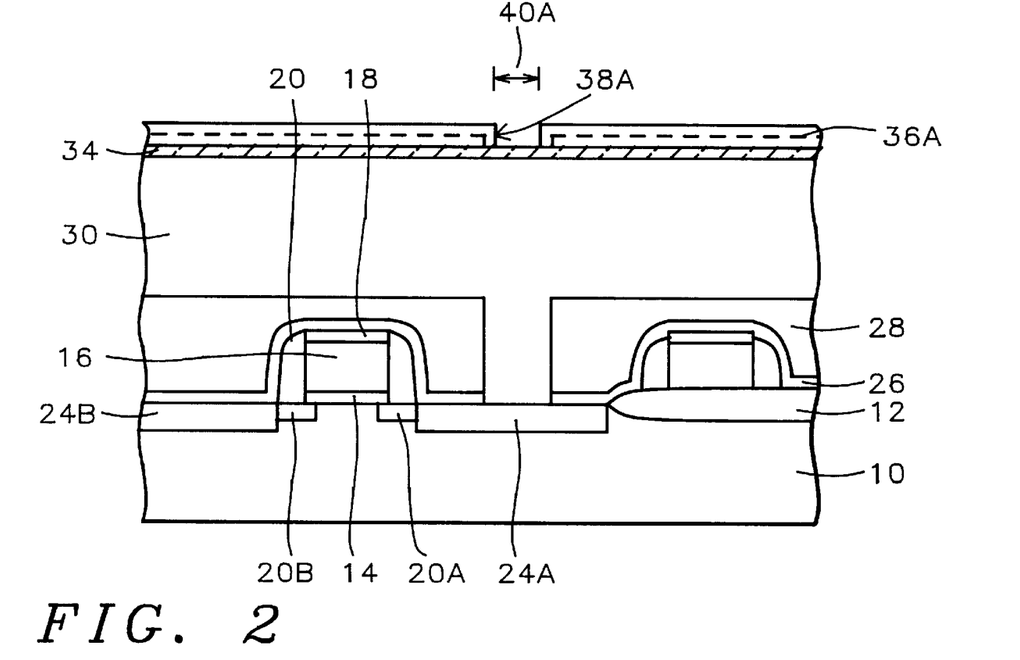
Figure 9:
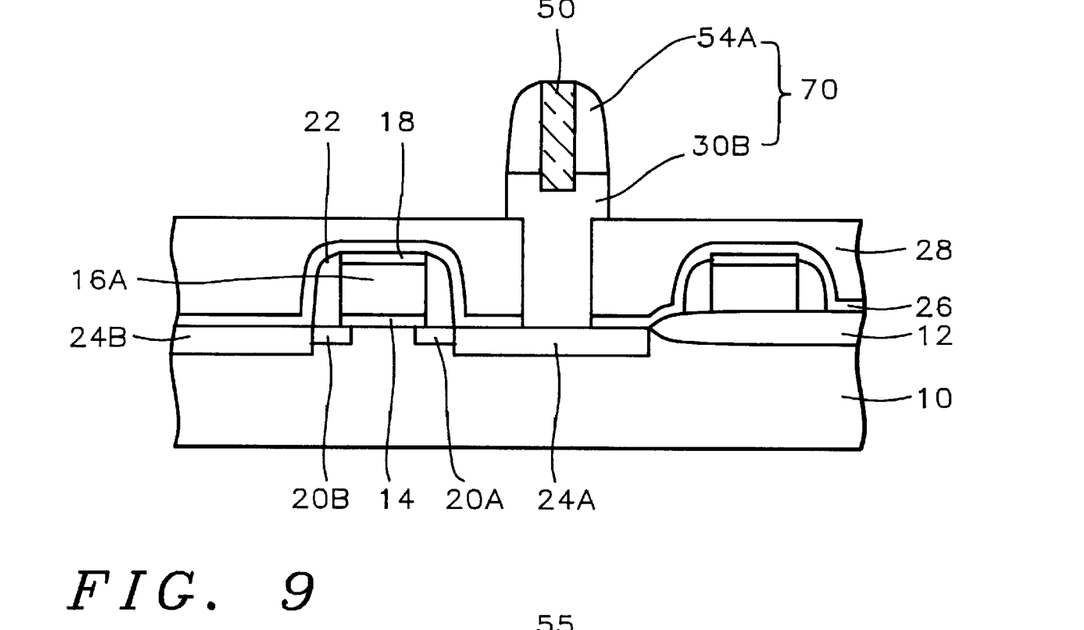

To accomplish the above objectives, the present invention provides a method of method of fabricating a capacitor of a semiconductor memory cell on a substrate 10 having an active area 24A, comprising the steps of:

a) (See FIG. 1) forming a planarized first insulating layer 28 over the substrate; the substrate having an active area;

b) forming a first opening 29 (e.g., contact opening) 29 in the first insulating layer 28 exposing the active area;

c) forming a first conductive layer 30 over the first insulating layer 28 and filling the first opening 29 and contacting the active area 24A;

d) forming an oxidation barrier layer 34 over the first conductive layer 30;

e) forming a polysilicon layer 36 over the first oxidation barrier layer 34;

f) forming a second opening 38 in the polysilicon layer 36; the second opening having an open dimension smaller than the minimum photolithographic ground rules;

g) oxidizing the polysilicon layer 36 forming a polyoxide layer 36A; and the polyoxide layer redefining the second opening as a third opening 38A; the third opening 38A having a smaller opening dimension than the second opening;

h) (See FIG. 3) anisotropically etching the oxidation barrier layer 34 and the first conductive layer 30 using the third opening 38A as an etch mask and forming an electrode center hole 44 extending at least partially through the first conductive layer 30; the electrode center hole having an open dimension smaller that the minimum photolithography dimension; the electrode center hole 44 having a depth into the first conductive layer in a range of between about 300 and 8000 Å;

i) (See FIG. 4) removing the polyoxide layer 36A;

j) (See FIG. 5) forming a first dielectric layer 48 over the oxidation barrier layer 34 and filling the electrode center hole 44; the first dielectric layer 48 having a thickness in a range of between about 500 and 2000 Å;

k) (See FIG. 6) removing the first dielectric layer 48 over the oxidation barrier layer 34 and forming a dielectric stud 50 filling the electrode center hole 44; the dielectric stud 50 having sidewalls;

l) (See FIG. 7)—removing the oxidation barrier layer 34 and removing a portion of the first conducting layer 30 using an anisotropically etch; the remaining first conducting layer 30A having a thickness over the first insulating layer 28 in a range of between about 2000 and 4000 Å;

m) (See FIG. 8) forming a second conducting layer 54 over the remaining first conducting layer 30A and the dielectric stud 50;

n) (See FIG. 9) anisotropically etching the second conducting layer 54 forming upper electrodes 54A on the sidewalls of the dielectric stud 50; and anisotropically etching the first conductive layer exposing the first insulating layer 38; the remaining first conductive layer in the first opening 29 forming a bottom plug 30B; the bottom plug 30B and the upper electrodes 54A forming a bottom electrode 54A 30B 70;

o) removing the dielectric stud 50;

p) (See FIG. 9) forming a capacitor dielectric layer 60 over the bottom electrode 70;

q) (See FIG. 10) forming a top electrode 64 over the capacitor dielectric layer 60.

The method of the present invention fabricates a capacitor having a smaller dimension than possible using conventional photolithographic methods. In particular, the electrode center opening 44 is smaller than the minimum photolithographic dimensions (e.g., photo ground rules, photo minimum dimension or tolerance). The polyoxide layer 36A reduces the second opening (now the third opening 38A) to a dimension smaller than the photo minimum dimension. Moreover, the dimension of the third opening 38A can be accurately controlled by varying the thickness of the polyoxide layer 36A.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

The present invention will be described in detail with reference to the accompanying drawings. The present invention provides a method of forming a DRAM having a cylindrical capacitor which has small dimension, high capacitance and is simple to manufacture. The present invention provides a method of manufacturing a capacitor for a memory cell which has a small electrode and more particularly an cylindrical electrode with a small central hole 55. See FIG. 10. The central hole 55 is smaller than the minimum photo dimensions.

The processes for forming the field oxide (FOX) and the field effect transistor structure as presently practiced in manufacturing DRAM cells are only briefly described in order to better understand the current invention. It should be will understood by one skilled in the art that by including additional process steps not described in this embodiment, other types of devices can also be included on the DRAM chip. For example, P wells in the P substrate and CMOS circuit can be formed therefrom. It should also be understood that the figures depict only several DRAM storage cells out of a multitude of cells that are fabricated simultaneously on the substrate. Also, the capacitor's use is not limited to DRAM devices and can be used in other device types, such as SRAM, and logic chips.

As shown in FIG. 1, the method for fabricating a cylindrical capacitor begins by providing a substrate having a field oxide layer 12 and FET devices formed thereon. Field oxide layer 12 is formed on a semiconductor substrate 10 for defining active device regions and isolation regions. The preferred substrate is composed of a P-type single crystal silicon having a (100) crystallographic orientation. A relatively thick field oxide (FOX) 12 is formed around the active device areas to electrically isolate these areas. This field oxide can be formed by masking the active device areas with a thick silicon oxide (pad oxide) and a thicker silicon nitride layer which forms an oxidation barrier. The silicon substrate is then oxidized in an oxidizing ambient to form the field oxide. The preferred thickness of the field oxide is in the range of about 3000 and 6000 Å.

The semiconductor FET device is then formed in the active device area (non-field oxide areas) after removing the silicon nitride barrier layer and the pad oxide in a conventional wet etch. The most commonly used device for dynamic random access memory (DRAM) is MOSFET. This device is formed by first thermally oxidizing the active device area to form a thin gate oxide. The preferred thickness is from about 65 to 150 Å.

An appropriately doped polysilicon layer, and an insulating layer are deposited over the gate oxide layer and conventional photolithographic techniques are used to pattern them into a transfer gate comprising a gate oxide 14, a gate electrode 16, and the gate insulating layer 18. As shown in FIG. 1, transfer gates 14 16 18 are formed over the field oxide layer 12 and on the substrate disposed between a source (node contact) 24A and a drain 24B. Often, the gate electrodes formed over the field oxide form the word lines that electrically connect to the appropriate peripheral circuits on the DRAM chip. The lightly doped source/drain (shown with the source/drain 20A 20B) of the N-channel MOSFET preferably is formed next, usually by implanting an N-type atomic species such as arsenic or phosphorus through the spaces between the gate electrodes 14 16 18. For example, a typical implant might consist of phosphorus P31 at a dose of between about 1 to 10 E13 atoms/cm$^2$ and at an energy between about 30 to 80 Kev.

After forming the lightly doped source/drain, sidewall spacers 20 are formed on the gate electrode 14 16 18 sidewalls. The transfer gate sidewall spacers 20 are preferably formed of silicon oxide or silicon nitride and are preferably formed of silicon nitride. The spacers 20 can have a thickness in the range of between about 400 to 1500 Å and more preferably about 800 Å. The spacers have a height in the range of between about 1500 to 3000 Å and more preferably about 2000 Å.

These sidewall spacers 20 are formed by depositing a low temperature silicon oxide and anisotropically etching back to the silicon surface. For example, the silicon oxide could be formed using a chemical vapor deposition using tetra-ethoxysilane (TEOS) at a temperature in the range of about 650° to 900° C. and the etch back performed in a low pressure reactive ion etcher.

The source/drain regions 24A 24B of the MOSFET are now implanted between the spacers 20 with a N type atomic species, for example, arsenic (As75), to complete the source/drain 24A 24B. The implantation is usually done through a thin layer of silicon oxide of about 200 to 300 Å in thickness to minimize implant channeling and to protect against contamination by metals and other impurities. A typical implantation dose is between 2E15 to 1E16 atoms/cm$^2$ and an energy of between about 20 to 70 Kev.

As shown in FIG. 1, an oxide layer (e.g., insulating layer) 26 is formed over the substrate surface, including the field oxide 12, active areas of the substrate and the gate structures 14 16 18 20. The oxide layer 26 preferably has a thickness in a range of between about 1000 and 2000 Å.

The remainder of this embodiment relates more specifically to those objects of the invention, which relate to the formation of the DRAM having a self-aligned node contact with a smaller size, less photo steps, increased capacitance, and also providing a more manufacturable process.

As shown in FIG. 1, a planarized first insulating layer 28 is formed over the substrate. The first insulating layer 28 is composed of a material selected from the group consisting of undoped oxide (e.g., formed by a $O_3$—TEOS process), phosphosilicate glass, borosilicate glass (BSG), and boro-phosphosilicate glass (BPSG) and is more preferably composed of BPSG. The first insulating layer preferably has a thickness in a range of between about 3000 and 8000 Å.

Next, a first opening 29 (e.g., contact opening) 29 is formed in the first insulating layer 28 exposing the active area (e.g., source 24A).

A first conductive layer 30 is then formed over the first insulating layer 28 and filling the first opening 29 and contacting the active area 24A. The first conductive layer is preferably composed of doped polysilicon and preferably has a thickness in a range of between about 4000 and 10,000 Å and preferably has a doping concentration in the range of between about 1E20 and 1E21 atoms/cm$^3$.

Still referring to FIG. 1, an oxidation barrier layer 34 is formed over the first conductive layer 30. The oxidation barrier layer 34 can be composed of any material that retards oxidation and is preferably composed of silicon nitride. The layer preferably has a thickness in a range of between about 100 and 400 Å.

A thin polysilicon layer (or amorphous silicon layer) 36 is subsequently formed over the first oxidation barrier layer 34. The polysilicon layer 36 preferably has a thickness in a range of between about 1000 and 4000 Å. second opening 38.

A second opening 38 is formed in the polysilicon layer 36 using photolithography processes. The second opening preferably has the smallest open dimension possible with capabilities of the photolithographic process (e.g., photo ground rules). The second opening can have any shape and is preferably circular or rectangular. Also see FIGS. 11A and 11B.

As shown in FIG. 2, the polysilicon layer 36 is oxidized to form a polyoxide layer 36A. The polyoxide layer redefines the second opening 38, now called the third opening 38A. The third opening 38A preferably has a smaller open dimension than the second opening.

The polysilicon layer 36 expands upward and sideways by about 50% when it is oxidized to form the polyoxide layer 36A. This expansion makes the third opening 38A smaller than the second opening 38 and smaller than the minimum photo dimension.

Figure 3:
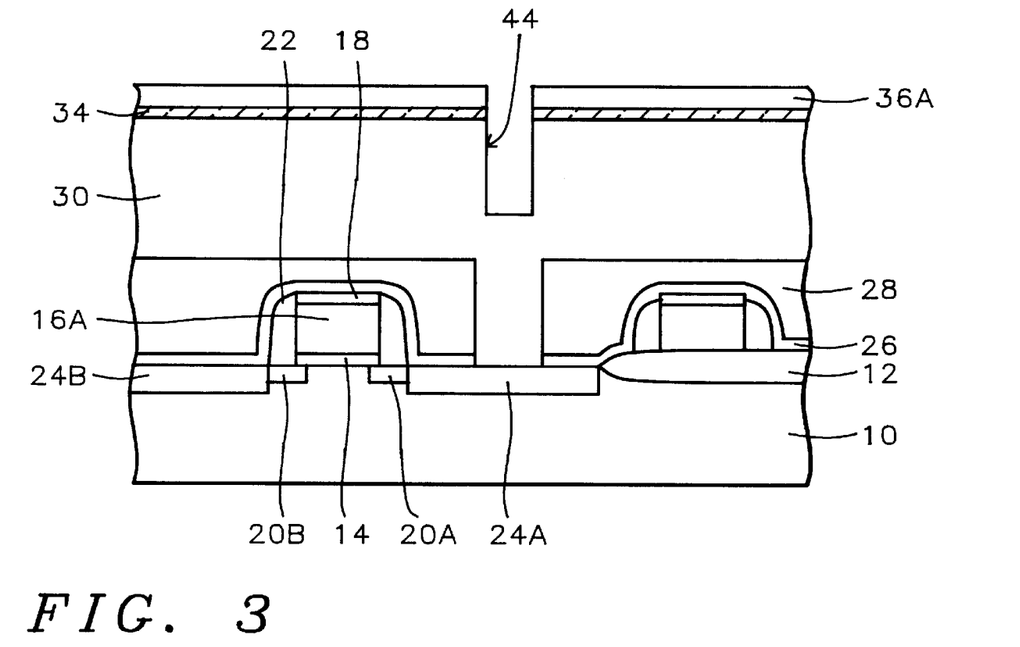

As shown in FIG. 3, the oxidation barrier layer 34 and the first conductive layer 30 are anisotropically etched using the third opening 38A as an etch mask. This etch forms an electrode center hole 44 extending at least partially through the first conductive layer 30. The electrode center hole 44 preferably has an open dimension smaller that the minimum photolithography dimension. The electrode center hole 44 preferably has a depth into the first conductive layer in a range of between about 3000 and 8000 Å. The same etch recipe preferably etches by the nitride and poly layer. The preferred etch is a $SF_6/Cl_2/O_2$ plasma etch.

Figure 4:
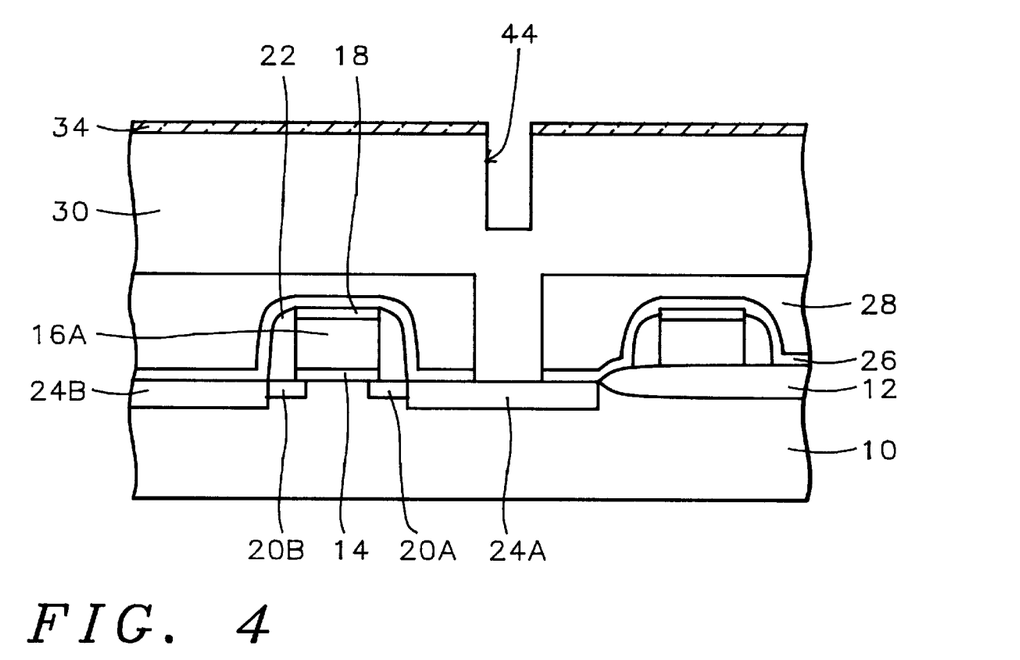

Referring to FIG. 4, the polyoxide layer 36A is removed with an etch that selectively etches the polyoxide and does not etch the polysilicon layer 30. Preferably the polyoxide layer 36A is removed using an MERIE (magnetic—Enhanced RIE) etch preferably using a $SF_6/Cl_2/O_2/HBr$ plasma.

Figure 5:
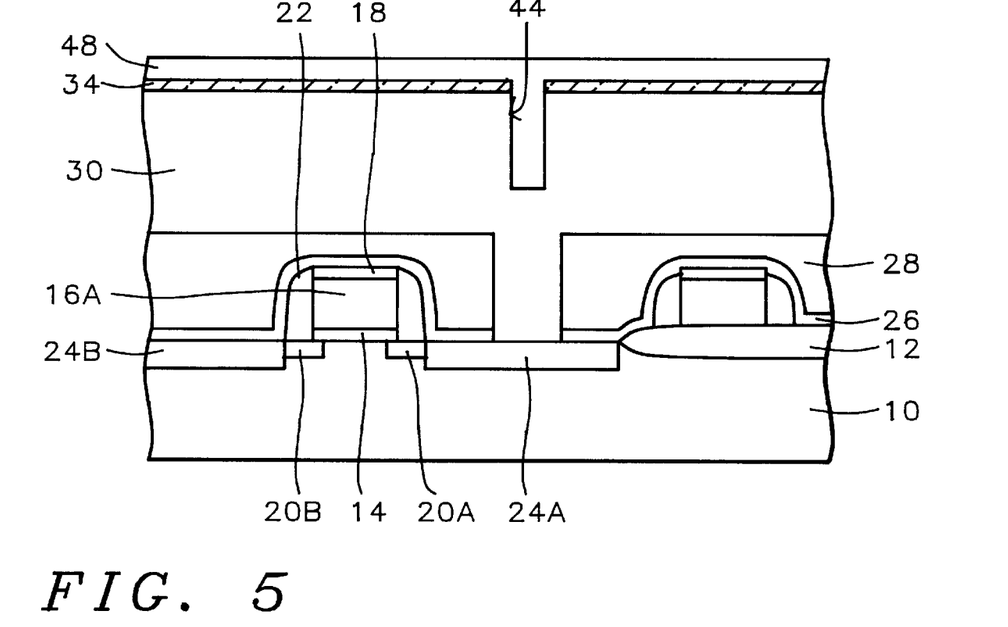

As shown in FIG. 5, a first dielectric layer 48 is formed over the oxidation barrier layer 34 and fills the electrode center hole 44. The first dielectric layer 48 preferably has a thickness over the oxide barrier layer 34 in a range of between about 500 and 2000 Å.

Figure 6:
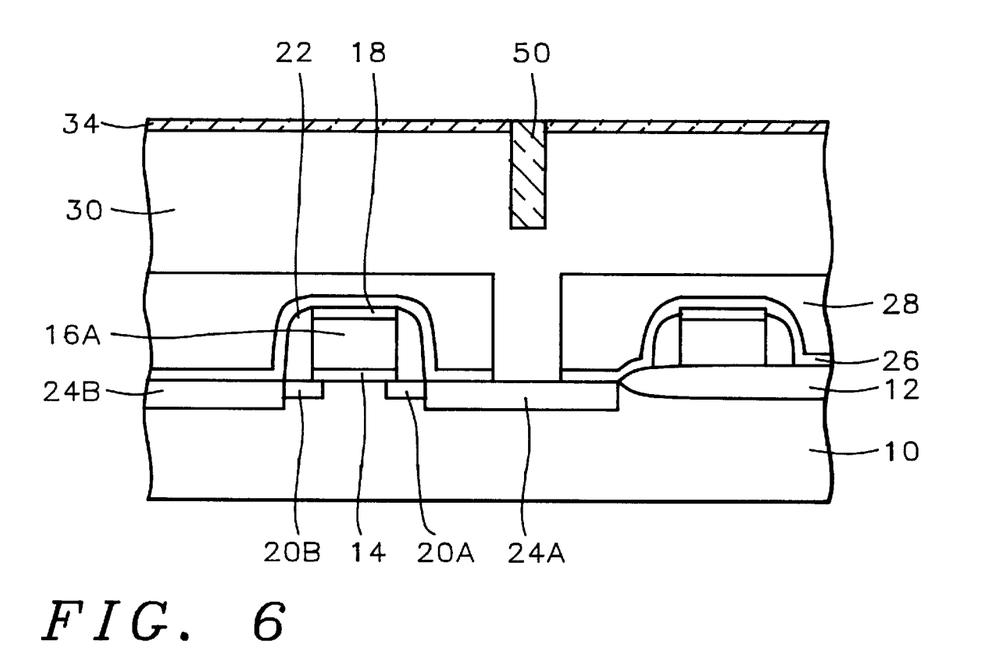

Turning to FIG. 6, the first dielectric layer 48 over the oxidation barrier layer 34 is now removed thereby forming a dielectric stud 50 filling the electrode center hole 44. The dielectric stud 50 has sidewalls. The first dielectric layer 48 over the oxidation barrier layer 34 is preferably removed using a chemical-mechanical polish (CMP) process. In this step, preferably the oxidation barrier layer 34 acts as a CMP stop layer.

Figure 7:
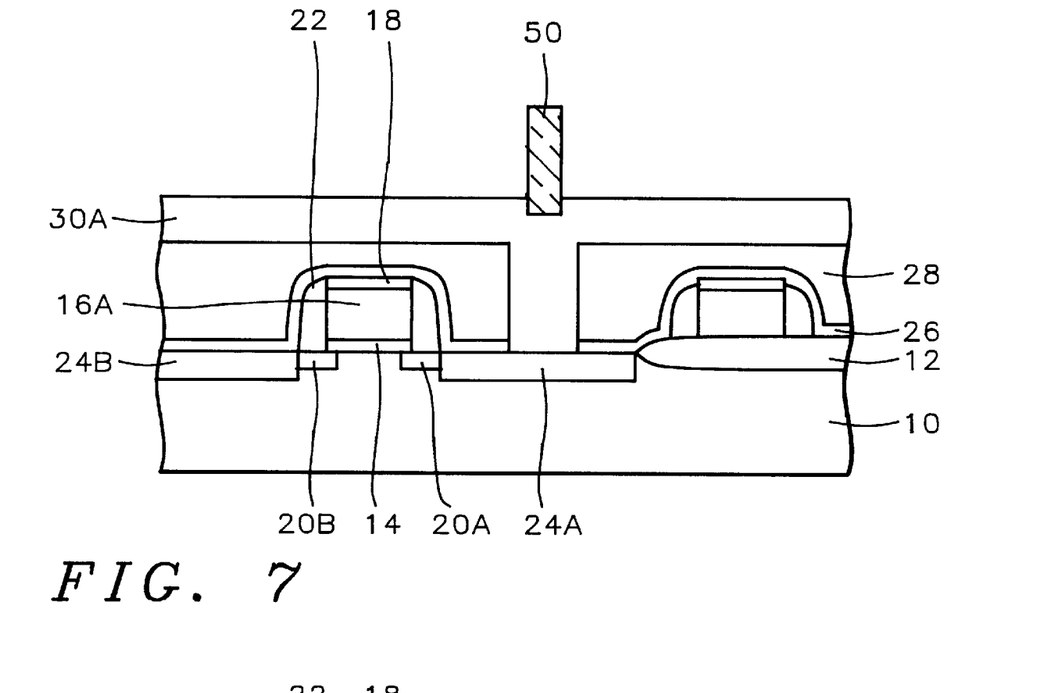

As shown in FIG. 7, the oxidation barrier layer 34 and a portion of the first conducting layer 30 is removed preferably using an anisotropic etch. The remaining first conducting layer 30A preferably has a thickness over the first insulating layer 28 in a range of between about 2000 and 3000 Å.

Figure 8:
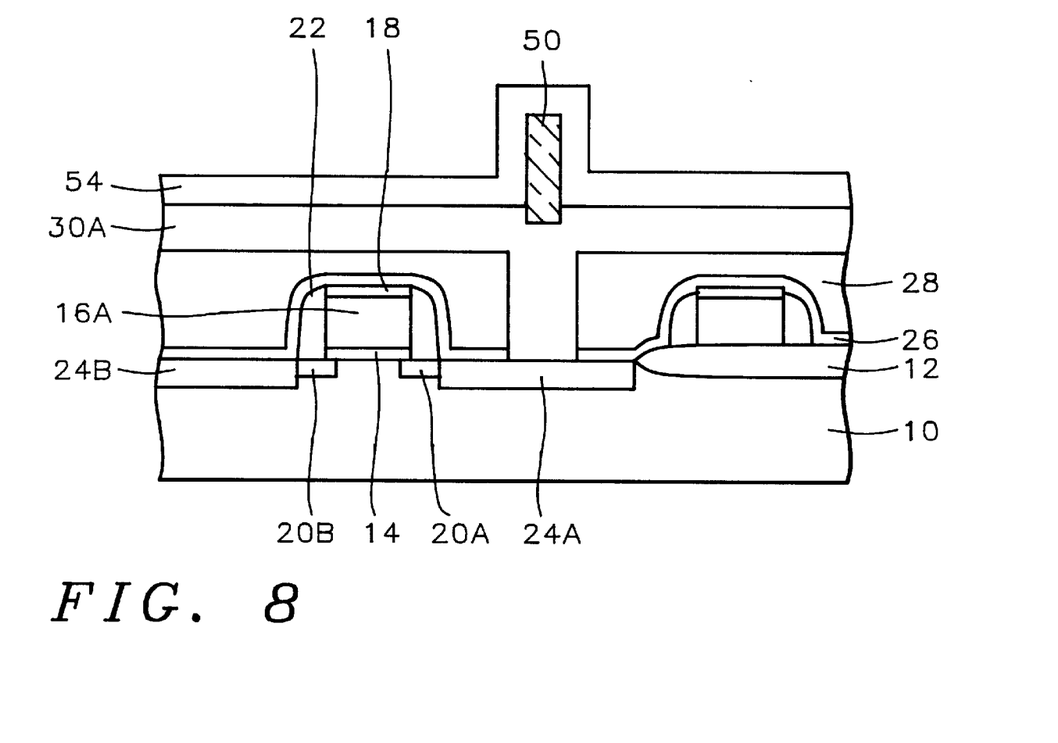

As seen in FIG. 8, a second conducting layer 54 is formed over the remaining first conducting layer 30A and the dielectric stud 50. The second conducting layer 54 preferably has a thickness in a range of between about 500 and 2000 Å and is preferably composed of doped polysilicon.

As shown in FIG. 9, the second conducting layer 54 is preferably anisotropically etched thereby forming upper electrodes 54A on the sidewalls of the dielectric stud 50. The anisotropic etch also etches removes the remaining first conductive layer 30A over the first insulating layer 28 thereby exposing the first insulating layer 28. The remaining first conductive layer under the upper electrodes 54A and the dielectric stud 50 forms a bottom plug 30B. The bottom plug 30B and the upper electrodes 54A form the bottom electrode 54A 30B (70).

Figure 10:
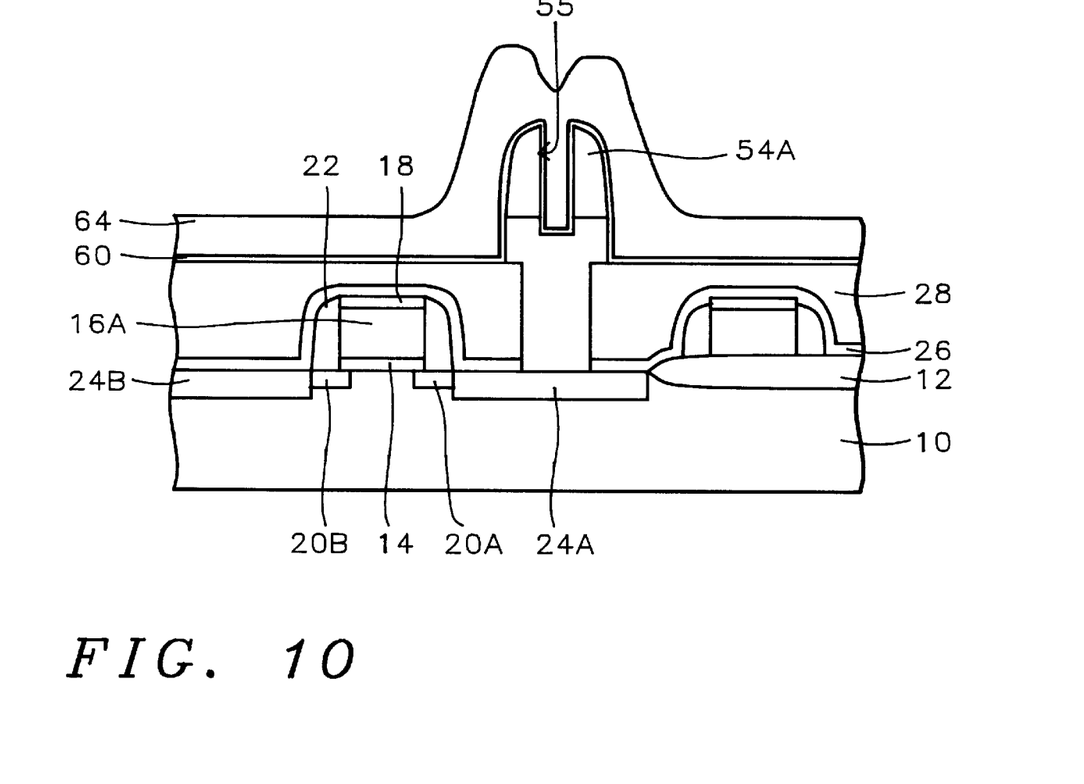

Referring to FIG. 10, the dielectric stud 50 is now removed forming the electrode center opening 55. The dielectric stud is preferably removed using an etch that selectively removes the dielectric stud (e.g., undoped oxide—$O_3$—TEOS) and does not significantly etch the insulating layer 28 (e.g., BPSG). The etch is preferably a HF or a vapor HF.

A preferred embodiment entails selectively forming a thin nitride layer on insulating layer 28. The thin nitride layer acts as a etch-stop layer. In another embodiment, the insulating layer 28 is composed of undoped oxide (e.g., $O_3$—TEOS process) which has a higher etch rate in HF.

Referring to FIG. 10, a capacitor dielectric layer 60 is formed over the bottom electrode 70. FIG. 10 shows the formation of the top electrode 64 over the capacitor dielectric layer 60. The top electrode is preferably composed of a doped polysilicon. The top electrode preferably has a thickness in a range of between about 1000 and 2000 Å.

Figure 11A:
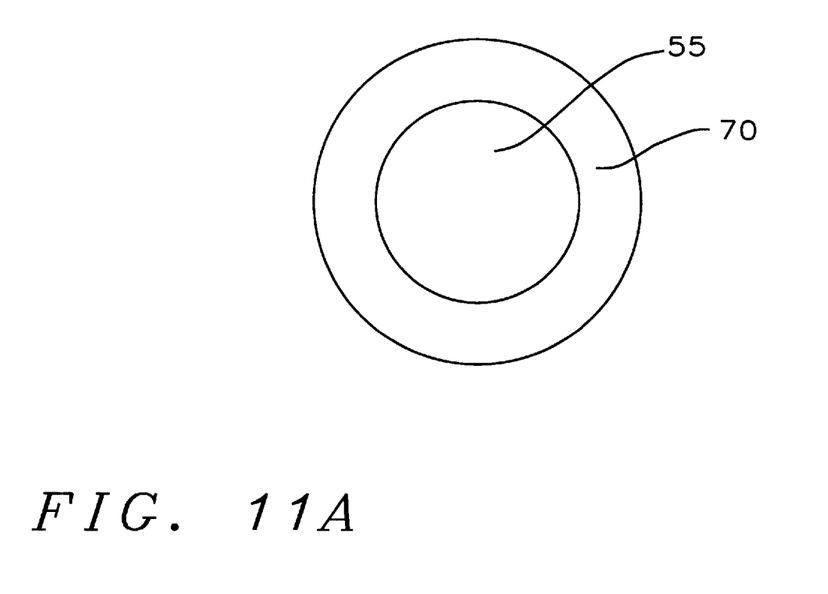
FIGS. 11A and 11B are top down views of the preferred embodiments electrode of the present invention.
Figure 11B:
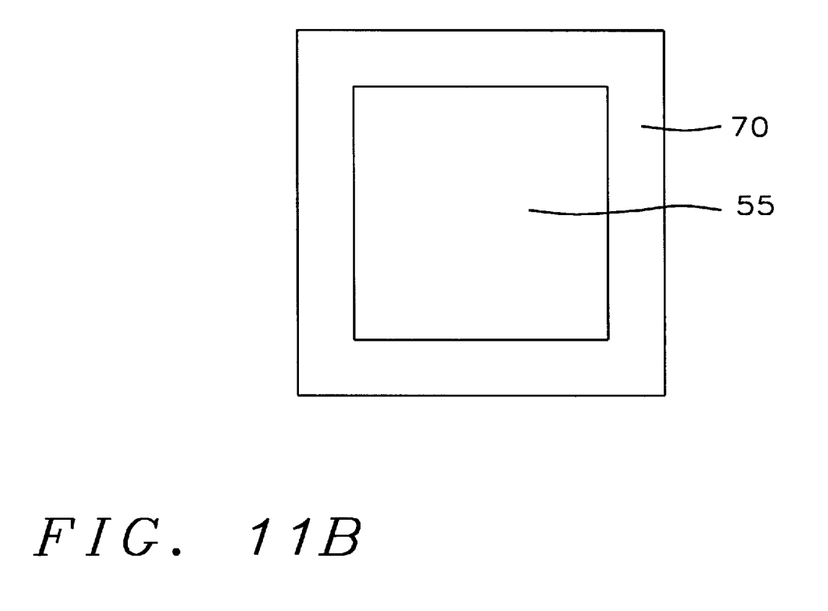

FIGS. 11A and 11B show top down views of preferred embodiments of the electrode of the present invention. The bottom cylindrical electrode 70 can have any shape such as cylindrical, square, and etc. with electrode center opening 55.

The method of the present invention fabricates a capacitor having a smaller dimension than possible using conventional photolithographic methods. In particular, the electrode center opening is smaller than the minimum photolithographic dimensions (e.g., photo ground rules, photo minimum dimension or tolerance). The polyoxide layer 36A reduces the second opening (now the third opening 38A) to a dimension smaller than the photo minimum dimension. Moreover, the dimension of the third opening can be controlled by varying the thickness of the polyoxide 38A layer. This allows the capacitor to be smaller and have a higher capacitance per unit area.

While the invention has been particularly shown and described with reference to the preferred embodiments thereof, it will be understood by those skilled in the art that various changes in form and details may be made without departing from the spirit and scope of the invention.

What is claimed is:

1. A method of fabricating a capacitor of a semiconductor memory cell on a substrate having an active area, comprising the steps of:

a) forming a planarized first insulating layer over said substrate, said substrate having the active area;

b) forming a first opening in said first insulating layer exposing said active area;

c) forming a first conductive layer over said first insulating layer and filling said first opening and contacting said active area;

d) forming an oxidation barrier layer over said first conductive layer;

e) forming a polysilicon layer over said oxidation barrier layer;

f) forming a second opening, using a photolithographic process, in said polysilicon layer; said second opening having an open dimension of a minimum photolithography dimension, a minimum size of a capability of said photolithographic process;

g) oxidizing said polysilicon layer forming a polyoxide layer; and said polyoxide layer redefining said second opening as a third opening; said third opening having a smaller open dimension than said second opening;

h) anisotropically etching said oxidation barrier layer and said first conductive layer using said third opening as an etch mask and forming an electrode center hole extending at least partially through said first conductive layer; said electrode center hole having an open dimension smaller than the minimum photolithography dimension;

i) removing said polyoxide layer;

j) forming a first dielectric layer over said oxidation barrier layer and filling said electrode center hole;

k) removing said first dielectric layer over said oxidation barrier layer forming a dielectric stud filling said electrode center hole; said dielectric stud having sidewalls;

l) removing said oxidation barrier layer and removing a portion of said first conducting layer using an anisotropically etch;

m) forming a second conducting layer over said remaining first conducting layer and said dielectric stud;

n) anisotropically etching said second conducting layer forming upper electrodes on said sidewalls of said dielectric stud; and anisotropically etching said first conductive layer exposing said first insulating layer; the remaining first conductive layer under said upper electrodes and said dielectric stud forming a bottom plug; said bottom plug and said upper electrodes forming a bottom electrode;

o) removing said dielectric stud;

p) forming a capacitor dielectric layer over said bottom electrode; and q) forming a top electrode over said capacitor dielectric layer.

2. The method of claim 1 wherein said first insulating layer is composed of a material selected from the group consisting of undoped oxide, phosphosilicate glass, borosilicate glass (BSG), and borophosphosilicate glass; said first insulating layer having a thickness in a range of between about 3000 and 8000 Å.

3. The method of claim 1 wherein said first conductive layer composed of doped polysilicon and has a thickness in a range of between about 4000 and 10,000 Å.

4. The method of claim 1 wherein said oxidation barrier layer is composed of silicon nitride; and has a thickness in a range of between about 100 and 400 Å.

5. The method of claim 1 wherein said polysilicon layer having a thickness in a range of between about 1000 and 4000 Å.

6. The method of claim 1 wherein said first dielectric layer over said oxidation barrier layer is removed using a chemical-mechanical polish process.

7. The method of claim 1 wherein said second conducting layer has a thickness in a range of between about 500 and 2000 Å and is composed of doped polysilicon.

8. A method of fabricating a capacitor of a semiconductor memory cell on a substrate having an active area, comprising the steps of:

a) forming a planarized first insulating layer over said substrate; said substrate having the active area; said first insulating layer is composed of a material selected from the group consisting of undoped oxide, phosphosilicate glass, borosilicate glass (BSG), and borophosphosilicate glass; said first insulating layer having a thickness in a range of between about 3000 and 8000 Å;

b) forming a first opening in said first insulating layer exposing said active area;

c) forming a first conductive layer over said first insulating layer and filling said first opening and contacting said active area; said first conductive layer composed of doped polysilicon and having a thickness in a range of between about 4000 and 10,000 Å;

d) forming an oxidation barrier layer over said first conductive layer; said oxidation barrier layer composed of silicon nitride; and has a thickness in a range of between about 100 and 400 Å;

e) forming a polysilicon layer over said oxidation barrier layer; said polysilicon layer having a thickness in a range of between about 1000 and 4000 Å;

f) forming a second opening in said polysilicon layer; said second opening having an open dimension of a minimum photolithography dimension, a minimum size of a capability of said photolithographic process;

g) oxidizing said polysilicon layer forming a polyoxide layer; and said polyoxide layer redefining said second opening as a third opening; said third opening having a smaller open dimension than said second opening;

h) anisotropically etching said oxidation barrier layer and said first conductive layer using said third opening as an etch mask and forming an electrode center hole extending at least partially through said first conductive layer; said electrode center hole having an open dimension smaller than the minimum photolithography dimension; said electrode center hole having a depth into said first conductive layer in a range of between about 3000 and 8000 Å;

i) removing said polyoxide layer;

j) forming a first dielectric layer over said oxidation barrier layer and filling said electrode center hole; said first dielectric layer having a thickness in a range of between about 500 and 2000 Å;

k) removing said first dielectric layer over said oxidation barrier layer forming a dielectric stud filling said electrode center hole; said dielectric stud having sidewalls; said first dielectric layer over said oxidation barrier layer is removed using a chemical-mechanical polish process;

l) removing said oxidation barrier layer and removing a portion of said first conducting layer using an anisotropically etch; the remaining first conducting layer having a thickness over said first insulating layer in a range of between about 2000 and 3000 Å;

m) forming a second conducting layer over said remaining first conducting layer and said dielectric stud; said second conducting layer having a thickness in a range of between about 500 and 2000 Å; and composed of doped polysilicon;

n) anisotropically etching said second conducting layer forming upper electrodes on said sidewalls of said dielectric stud; and anisotropically etching said first conductive layer exposing said first insulating layer; the remaining first conductive layer under said upper electrodes and said dielectric stud forming a bottom plug; said bottom plug and said upper electrodes forming a bottom electrode;

o) removing said dielectric stud;

p) forming a capacitor dielectric layer over said bottom electrode; and q) forming a top electrode over said capacitor dielectric layer.

* * * * *